United States Patent [19]

Bundy

[11] Patent Number: 4,727,332

[45] Date of Patent: Feb. 23, 1988

[54] CONTROLLABLE LIMITER

[75] Inventor: John E. Bundy, Rockford, Ill.

[73] Assignee: Sundstrand Corporation, Rockford, Ill.

[21] Appl. No.: 900,722

[22] Filed: Aug. 27, 1986

[51] Int. Cl.⁴ .......................... H03K 5/08; H03B 1/04; G06G 7/12

[52] U.S. Cl. .................... 328/169; 307/493; 307/551; 307/561

[58] Field of Search ............. 328/169, 172, 175, 168; 307/264, 359, 561, 562, 565, 362, 494, 350, 540, 546, 551, 553, 493, 552

[56] References Cited

U.S. PATENT DOCUMENTS

| | | | |
|---|---|---|---|
| 3,058,068 | 10/1962 | Hinrichs et al. | 307/562 |
| 3,424,987 | 1/1969 | Flurr | 307/540 |
| 3,437,836 | 4/1969 | Hull | 307/555 |
| 3,514,635 | 5/1970 | Gilbert | 307/553 |
| 3,697,780 | 10/1972 | Michael et al. | 307/360 |
| 3,818,356 | 6/1974 | Kinbara | 307/362 |
| 3,916,330 | 10/1975 | Weissman | 328/171 |
| 3,999,084 | 12/1976 | Beaudette | 307/563 |
| 4,095,126 | 6/1978 | Hoffman et al. | 307/553 |
| 4,487,109 | 12/1984 | Burandt et al. | 91/506 |

Primary Examiner—Stanley D. Miller
Assistant Examiner—Trong Q. Phan
Attorney, Agent, or Firm—Wood, Dalton, Phillips, Mason & Rowe

[57] ABSTRACT

A limiter for limiting an input signal includes a first clamping circuit for clamping the input signal at a first level so that the input signal cannot rise substantially above such first level, a second clamping circuit for clamping the input signal at a second level less than the first level so that the input signal cannot drop substantially below such second level and a single operational amplifier having an input which receives the clamped input signal and an output at which is developed an output signal that is a scaled version of the clamped input signal. The limiter may be used as either a static or dynamic limiter, is simple in design, inexpensive, and can be used in a wide variety of applications.

8 Claims, 2 Drawing Figures

CONTROLLABLE LIMITER

DESCRIPTION

1. Technical Field

The present invention relates generally to signal processing circuits, and more particularly to limiter circuits.

2. Background Art

Most control systems utilize limiters to prevent dangerous and/or destructive operation of an output device operated by the control system. For example, in Burandt et al U.S. Pat. No. 4,487,109, there is disclosed a control for a hydraulic power unit having a swashplate or wobbler which is displaceable between stops or limits. In this system, it is desirable to prevent destructive contact of the wobbler with the stops. This condition, termed "mechanical saturation", can be avoided by introducing electrical saturation in the circuitry of the control system. One way in which this can be accomplished is to utilize a limiter which limits the magnitude of a command signal which comprises an input to the control system.

Most limiters are of the static type wherein the limiter provides linear amplification between predetermined upper and lower saturation or cutoff points and wherein the output voltage is limited to a first predetermined value when the input voltage is above the upper cutoff or saturation point and is limited to a second predetermined value when the input voltage is below the second cutoff or saturation point. Such limiters, owing to their unchanging saturation points, necessarily limit the control signals which operate the output device even when there is no danger that the output device will undergo mechanical saturation. This results in an undesirable increase in response time of the output device, which may in turn render the overall control system unsuitable in certain applications requiring fast response times.

Dynamic limiters have been devised wherein the upper and lower saturation points of the limiter are dynamically controlled. This is accomplished by utilizing a dynamically variable voltage source as a control input to the limiter. Such a limiter is disclosed in Beaudette U.S. Pat. No. 3,999,084. However, Beaudette does not disclose the precise construction of the variable voltage source, other than to note that it may comprise, for example, an amplifier. There is no disclosure or suggestion as to the nature of the signal developed by the variable voltage source, nor is there any disclosure or suggestion of how and in what type of circuit such a limiter might be used.

Furthermore, the Beaudette limiter requires the use of multiple operational amplifiers, and hence it is a relatively complex circuit.

SUMMARY OF THE INVENTION

In accordance with the present invention, a limiter for limiting an input signal is simple in design yet provides the capability of static or dynamic operation.

The limiter includes a single operational amplifier, a first clamping circuit for clamping the input signal to the amplifier at a first level so that the input signal cannot rise substantially above such first level and a second clamping circuit for clamping the input signal to the amplifier at a second level less than the first level so that such signal cannot drop substantially below the second level. The operational amplifier includes an input which receives the clamped input signal and an output at which is developed an output signal that is a scaled version of the clamped input signal.

Each of the first and second clamping circuits includes a diode and a bias circuit coupled to the diode for determining the first and second levels. In a preferred embodiment of the invention, each of the bias circuits includes a potentiometer which is manually-adjustable to vary the first and second levels. Further, a variable voltage source may be coupled to each of the potentiometers so that dynamic limiting can be achieved.

Means may also be provided for adjusting the gain of the amplifier so that virtually any desired limiting transfer function can be realized.

BEST MODE FOR CARRYING OUT THE INVENTION

Figure 1:
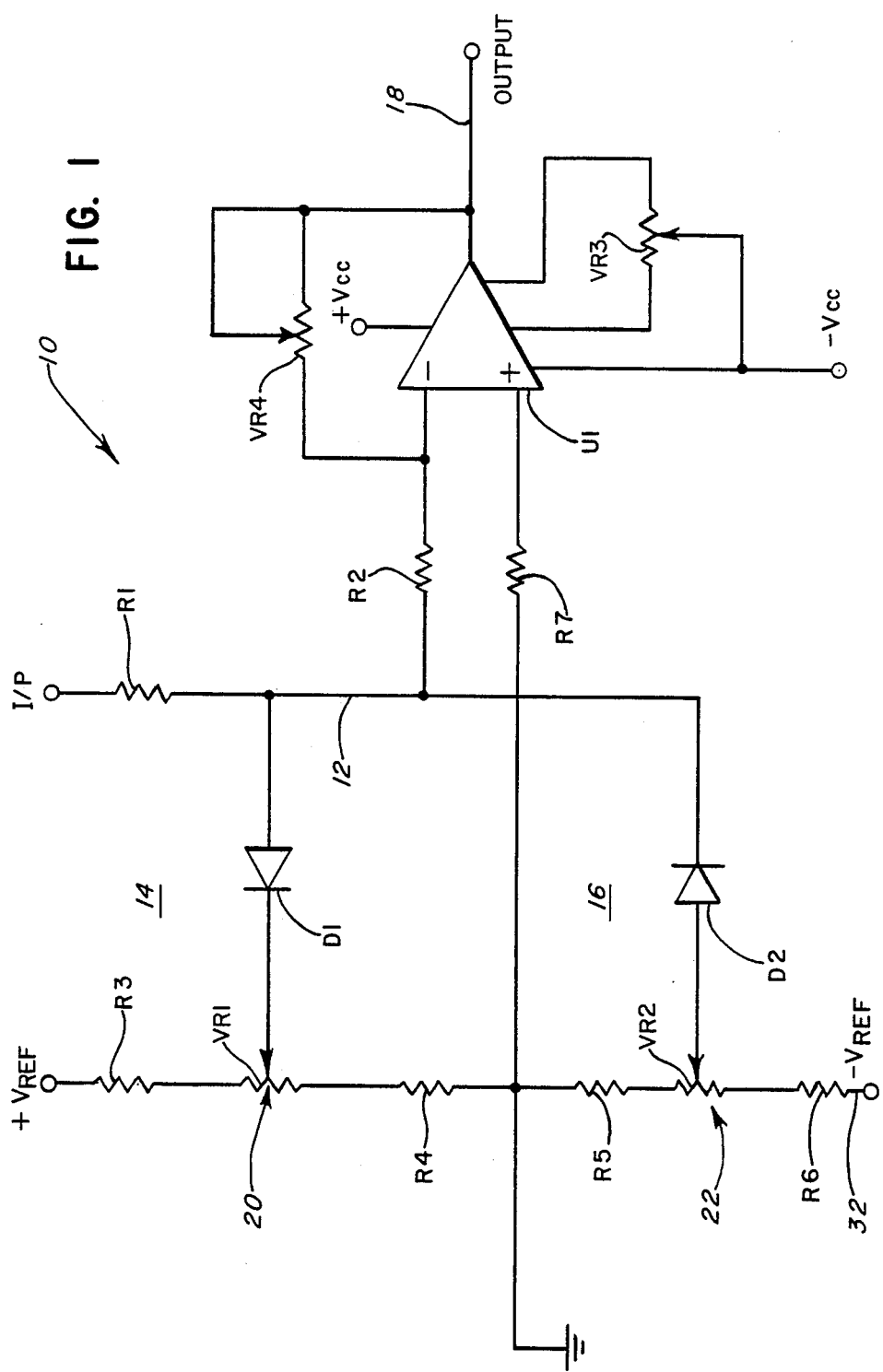
FIG. 1 is a schematic diagram of the limiter of the present invention.

Referring now to FIG. 1, a limiter 10 according to the present invention includes a single operational amplifier (or op amp) U1 having inverting and noninverting inputs and an output. The inverting input receives an analog signal to be limited through first and second resistors R1 and R2. An amplifier input signal is developed at a junction 12 between the resistor R1 and R2. The junction 12 is coupled to first and second clamping circuits, indicated generally at 14 and 16, which clamp the amplifier input signal at first and second levels, respectively. That is, the first clamping circuit 14 prevents the amplifier input signal at the junction 12 from rising substantially above the first level while the second clamping circuit 16 prevents the amplifier input signal appearing at the junction 12 from dropping substantially below the second level. In practice, the first and second levels are of opposite polarity, although this need not be the case.

The resistor R1 permits the ampifier input signal voltage to remain constant when one of the diodes 14,16 is conducting even with changes in the analog signal voltage.

The inverting input of the op amp U1 receives the clamped amplifier input signal at the junction 12 and develops an output on a line 18 which is a scaled version of the clamped input signal.

The first clamping circuit 14 includes a diode D1 coupled to the junction 12 and a bias circuit 20 coupled to the diode D1 which includes a first manually-adjustable potentiometer VR1 coupled between resistors R3 and R4. The first bias circuit is coupled at one end to ground potential and at a second end to a first voltage source which develops a voltage $+V_{REF}$ at a control input 30.

In like fashion, the second clamping circuit includes a clamping diode D2 which is coupled between the junction 12 and a second bias conduit 22. The second bias circuit 22 includes a second manually-adjustable potentiometer VR2 coupled between resistors R5 and R6. The second bias circuit 22 is coupled between ground potential and a second voltage source which develops a voltage $-V_{REF}$ at a control input 32.

A noninverting input of the operational amplifier U1 is coupled through a resistor R7 to ground potential. A third potentiometer VR3 is coupled to control inputs of the operational amplifier U1 to provide adjustment of the offset bias thereof.

During operation of the limiter 10, the voltage at the point 12 is limited to one diode voltage drop above the voltage developed at the wiper of the potentiometer VR1. Likewise, the voltage at the junction 12 is limited to one diode voltage drop below the voltage developed at the wiper of the potentiometer VR2. For voltages between these upper and lower limits, the limiter acts as a linear amplifier.

A fourth potentiometer VR4 is coupled between the output of the operational amplifier U1 and the inverting input thereof. The wiper of the potentiometer VR4 is manually-adjustable to in turn vary the gain of the linear amplifier implemented in prat by the op amp U1.

In a first embodiment of the invention, the voltages $+V_{REF}$ and $-V_{REF}$ coupled to the control inputs 30,32 of the limiter 10 are provided by a constant voltage source. In this case, the first and second cutoff or saturation points of the limiter may be independently varied by adjustment of the manual potentiometers VR1 and VR2.

Figure 2:
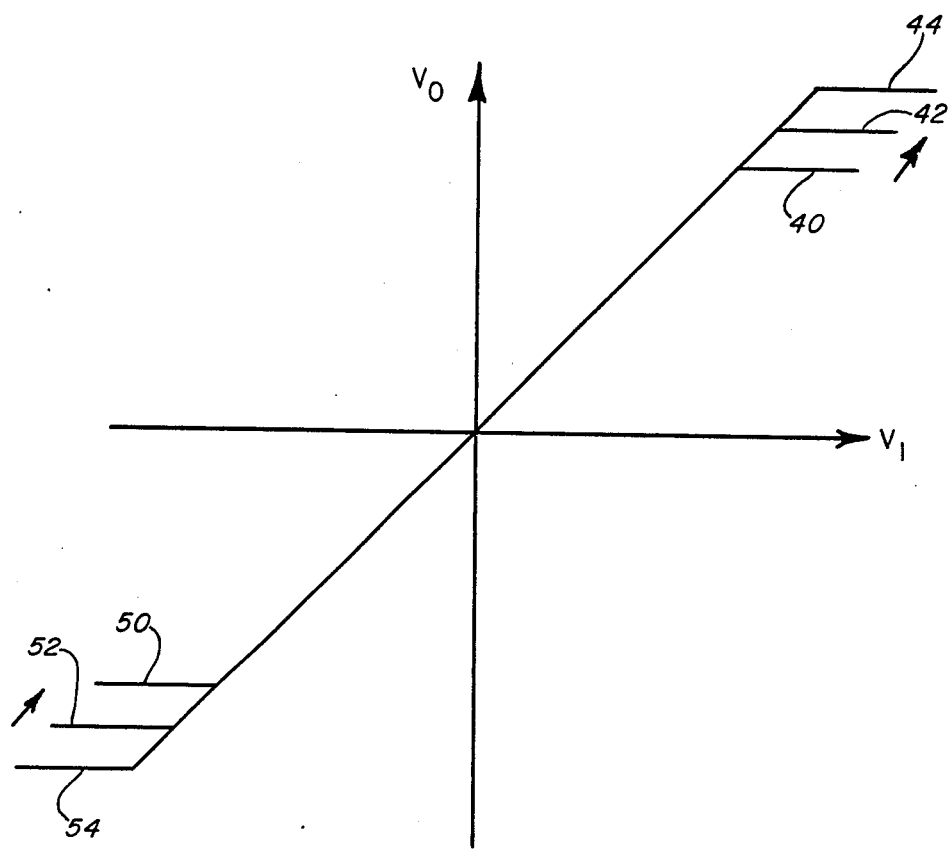
FIG. 2 is diagram illustrating various transfer functions which can be realized by the limiter illustrated in FIG. 1.

Referring also to FIG. 2 which illustrates the possible transfer functions which can be realized by the limiter shown in FIG. 1, manual adjustment of the potentiometer VR1 varies the first or positive saturation point of the limiter 10. For example, one setting of the potentiometer VR1 may result in a portion of the transfer function shown by a line 40, while other settings of the potentiometer VR1 may result in the transfer functions illustrated by lines 42 and 44. Of course, the point at which the break or knee in the transfer function occurs is infinitely variable by adjustment of the potentiometer VR1.

In like fashion, an infinite number of negative transfer function portions can be realized by adjustment of the potentiometer VR2, some of which are illustrated by lines 50, 52 and 54.

It should be noted that, owing to the independent adjustability of the potentiometers VR1 and VR2, the transfer function need not be symmetric about the origin. That is, the upper and lower limited voltages may not be of equal absolute value.

In FIG. 2, it is assumed that the operational amplifier U1 is operated as a unity gain amplifier, and hence the slope of the curve in the linear amplification range of the limiter is equal to 45°. The amplifier gain, and hence the slope of this portion of the transfer function may be varied by adjustment of the potentiometer VR4. This feature, together with the ability to independently vary the upper and lower limited voltages, results in the advantage that practically any desired limiter transfer function can be realized.

In a second embodiment of the invention, the voltages $+V_{REF}$ and $-V_{REF}$ are variable and are supplied by a limiter control circuit (not shown) which adjusts the voltages so that dynamic limiting is accomplished. In this case, the saturation or cutoff points are dynamically controlled during operation of the limiter so that only the desired amount of limiting is effected for a particular application. In this case, the potentiometers VR1 and VR2 may be adjusted before the limiter is operating so that the desired range of cutoff points can be realized.

The instant limiter may be utilized in a variety of situations wherein it is desired to provide limiting of an analog signal. For example, the limiter may be utilized in the servo loop control circuit illustrated in applicant's copending application Ser. No. 900,721, filed Aug. 27, 1986, entitled "Servo Loop Control System with Dynamic Limiting", assigned to the assignee of the instant application and the disclosure of which is hereby incorporated by reference.

As noted in the above-referenced copending application, the limiter may be used to limit a command signal to a servo loop control system which in turn controls a swashplate or wobbler of a hydraulic power unit to prevent destructive contact of the wobbler with mechanical stops. A limiter control circuit is responsive to an input from one or more position and/or velocity sensing transducers which sense various operating conditions of the power unit and load driven thereby and dynamically modulates the voltages $+V_{REF}$ and $-V_{REF}$ coupled to the control inputs 30,32 of the limiter.

Additional description of the operation of the servo loop control system may be obtained by reference to the above-identified application.

The present invention permits the realization of any of an infinite number of limiter transfer functions utilizing only one operational amplifier. The limiter is thus simple in design, inexpensive and capable of use in a wide variety of applications.

I claim:

1. A limiter for developing an output signal which is a scaled and limited version of an input signal, comprising:

first and second clamping circuits connected together at a junction which receive the input signal wherein the clamping circuits together develop an amplifier input signal that is clamped at first and second levels such that the amplifier input signal cannot rise substantially above the first level nor drop substantially below the second level and wherein the amplifier input signal corresponds to the input signal when the former is between the first and second levels;

a single operational amplifier having an input which receives said amplifier input signal and an output which develops the output signal, wherein said operational amplifier is connected in a linear amplifier configuration; and means coupled to the amplifier for adjusting the gain thereof.

2. The limiter of claim 1, wherein the first and second clamping circuits include first and second diodes respectively, each having anode and cathode electrodes wherein the anode of the first diode and the cathode of the second diode are connected to the junction, the cathode of the first diode is connected to a first bias circuit which determines the first level and the anode of the second diode is connected to the second bias circuit which determines the second level.

3. The limiter of claim 2, wherein each of the bias circuits includes a manually-adjustable potentiometer coupled to a constant voltage source.

4. The limiter of claim 2, wherein each of the bias circuits includes a voltage source which is variable during operation of the limiter to thereby vary the first and second levels.

5. The limiter of claim 2, wherein each of the bias circuits includes a manually-adjustable potentiometer coupled to the diode and a voltage source coupled to the potentiometer, each of the first and second levels being adjustable by either manual adjustment of the potentiometer or by varying the voltage developed by the voltage source.

6. The limiter of claim 1, wherein the gain adjusting means comprises a manually-adjustable potentiometer connected between the output and the input of said operational amplifier.

7. A limiter for limiting an analog signal, comprising:
means for isolating the analog signal to derive an input signal;
a first clamping circuit for clamping the input signal at a first level so that the input signal cannot rise substantially above such first level;
a second clamping circuit for clamping the input signal at a second level less than the first level so that the input signal cannot drop substantially below such second level;
each of the first and second clamping circuits including a diode coupled to a junction which receives the input signal, a manually-adjustable potentiometer coupled to the diode and a voltage source coupled to the manually-adjustable potentiometer wherein adjustment of the first and second levels may be affected either by manual adjustment of the respective potentiometer or by varying the voltage developed by the respective voltage source; and
an operational amplifier having an input coupled to the junction at which the clamped input signal is developed and an output at which is developed an output signal that is a scaled version of the clamped input signal wherein the limiter acts as a linear amplifier for input signals greater than the second level but less than the first level.

8. The limiter of claim 7, further including an additional adjustable potentiometer coupled between the output and the input of said operational amplifier thereof for adjusting the gain of the amplifier.

* * * * *